United States Patent
Liu

(10) Patent No.: US 8,471,579 B2
(45) Date of Patent: Jun. 25, 2013

(54) METHOD OF MEASURING SLIDER RESISTANCE OF DIFFERENT TYPES OF ROW BAR WITH A COMMON TESTER

(75) Inventor: Jian Liu, DongGuan (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 222 days.

(21) Appl. No.: 12/805,867

(22) Filed: Aug. 20, 2010

(65) Prior Publication Data

US 2011/0241707 A1 Oct. 6, 2011

(30) Foreign Application Priority Data

Mar. 31, 2010 (CN) .......................... 2010 1 0144633

(51) Int. Cl.
*G01R 31/20* (2006.01)
*G01R 27/08* (2006.01)

(52) U.S. Cl.
USPC .............. 324/754.1; 324/754.11; 324/754.16; 324/691

(58) Field of Classification Search
USPC ............. 324/691, 210, 754.1, 754.11, 754.16
See application file for complete search history.

(56) References Cited

U.S. PATENT DOCUMENTS

| | | | | |
|---|---|---|---|---|
| 6,731,110 | B2 * | 5/2004 | Church | 324/210 |
| 7,026,823 | B2 * | 4/2006 | Takanuki et al. | 324/525 |
| 7,049,809 | B2 * | 5/2006 | Luo et al. | 324/210 |
| 7,359,152 | B2 * | 4/2008 | Matono et al. | 360/125.33 |
| 2009/0289626 | A1 * | 11/2009 | Iben | 324/252 |

* cited by examiner

*Primary Examiner* — Patrick Assouad
*Assistant Examiner* — Christopher McAndrew
(74) *Attorney, Agent, or Firm* — Nixon & Vanderhye PC

(57) ABSTRACT

A method of measuring slider resistance of different types of row bar with a common tester comprises judging the type of the row bar, if the row bar is femto-type row bar, supplying a first voltage to the front pins, and supplying a second voltage that is unequal to the first voltage to the back pins, thereby obtaining resistances of the sliders; if the row bar is shunting-type row bar, supplying a third voltage to the front pins which contact the test pads, and supplying a fourth voltage that is unequal to the third voltage to the front pin that contacts the common test pad, thereby obtaining resistances of the sliders. The present invention can measure two different types of row bar with a same common tester, which can reduce the downtime of machine and the manpower, and prevent the probe card from being damaged without a frequent disassembly and switch.

9 Claims, 6 Drawing Sheets

METHOD OF MEASURING SLIDER RESISTANCE OF DIFFERENT TYPES OF ROW BAR WITH A COMMON TESTER

This application claims priority to Chinese Application No. 201010144633.1 filed Mar. 31, 2010, the entire contents of which are hereby incorporated by reference in this application.

FIELD OF THE INVENTION

The present invention relates to the field of slider of disk drive device, more particularly, to a method of measuring slider resistance of different types of row bar with a common tester.

BACKGROUND OF THE INVENTION

A hard disk drive incorporating rotating magnetic disks is commonly used for storing data in the magnetic media formed on the disk surfaces, and a magnetic recording head is used in hard disk drive to magnetically record information on a rotating disk.

Magnetic heads are typically constructed on a wafer that is sliced into separate row bars. Each row bar has a number of individual recording heads. The row bar is eventually sawed into individual elements and each individual element is assembled to a head gimbal assembly (HGA) of a hard disk drive.

Each magnetic head of the row bar is typically tested before being sawed into individual components to insure that the magnetic heads comply with manufacturing specifications. For example, a read head of the magnetic head includes a magnetoresistive (MR) element that has a MR height that must be lapped to achieve a predetermined value. Typically, the lapping quantity is determined by the resistance variety of the magnetic head before lapping and after lapping. The resistance of the individual slider after being lapped is required to be identical with the predetermined resistance value. Thus, the resistance of each slider on a row bar must be measured before cutting into an individual element within a tester.

A common tester for measuring resistance includes a probe card that has a plurality of probe pins which make simultaneous contact with the electrical lapping guide (ELG) pads formed on the surface of each slider cutting portion. The pins are coupled to a measuring board through a connector to make up a current loop with each slider on the row bar, as so to measure a resistance of each slider respectively. And the type of probe card is different which is determined by the types of the row bar. Nowadays, there are two kinds of typical row bars that include shunting-type row bar and femto-type row bar respectively. Inside the shunting-type row bar, one pole of each slider is connected together to form a connection common port, namely there is a connection common port shared with each slider on a shunting-type row bar. Inside the femto-type row bar, however, each slider is separated from each other in the internal connection.

Therefore, due to the different internal connections in two types row bar, a normal probe card is commonly used to measure the slider resistance of the femto-type row bar, and a shunting probe card is used to measure the slider resistance of the shunting-type row bar separately. The normal probe card has two rows of pins which are contact the two ELG pads formed on the cutting portion of the slider of the femto-type row bar respectively and a connector connected to the pins and coupled to the measuring board. While the shunting probe card only has a row of pins and a connector connected to the pins and coupled to a measuring board, one of the pins is supplied a voltage, and the rest of the pins contact the ELG pad formed on the cutting portion of the slider of the shunting-type row bar and is supplied another voltage, so as to form a current loop to obtain resistances of sliders.

Generally, the two said types of row bars are measured with a same measuring device to economize on cost. Thus, two types of probe cards will be disassembled and switched each other frequently, which the disassembly process is complicated and time-consuming. Thus, the downtime of the machine becomes longer, and the manpower is increased simultaneously. Moreover, the probe card will be damaged easily during the disassembly and switch process, in turn, shorten the life of the probe card.

Hence, it is desired to provide an improved method of measuring slider resistance of different types of row bar with a common tester to overcome the above-mentioned drawbacks.

SUMMARY OF THE INVENTION

One aspect of the present invention is to provide a method of measuring slider resistance of different types of row bar with a common tester, which can reduce the downtime of machine and the manpower, and prevent the probe card from being damaged without a frequent disassembly and switch.

To achieve above objective, a method of measuring slider resistance of different types of row bar with a common tester, the types of row bar comprising femto-type row bar and shunting-type row bar, the femto-type row bar comprising a row of sliders each of which has a front electrical lapping guide pad and a back electrical lapping guide pad, the shunting-type row bar comprising at least one set of sliders and one common test pad connecting with the set of sliders, each slider of the shunting-type row bar having a test pad, the tester having a probe card with a row of front pins and a row of back pins, the method comprising:

(1) placing one row bar on the tester;

(2) judging the type of the row bar, if the row bar is femto-type row bar, performing steps (3)-(4), and if the row bar is shunting-type row bar, performing steps (5)-(6);

(3) contacting the front electrical lapping guide pads of the sliders with the front pins of the probe card respectively, and contacting the back electrical lapping guide pads of the sliders with the back pins of the probe card respectively;

(4) supplying a first voltage to the front pins, and supplying a second voltage that is unequal to the first voltage to the back pins, thereby obtaining resistances of the sliders;

(5) contacting the common test pad of the shunting-type row bar with one of the front pins of the probe card, and contacting the test pads of the sliders with the rest of the front pins of the probe card respectively; and (6) supplying a third voltage to the front pins which contact the test pads, and supplying a fourth voltage that is unequal to the third voltage to the front pin that contacts the common test pad, thereby obtaining resistances of the sliders.

In a preferable embodiment, the method further comprises storing the row bar information to a data base before placing one row bar on the tester.

Preferably, the row bar information includes type information of row bar and amount information of sliders.

Preferably, after judging the type of the row bar, the method further comprises accessing and calling the row bar information stored in the data base.

Preferably, the probe card has ten front pins and ten back pins.

Preferably, the row bar further comprises cutting portions formed adjacent to each slider respectively.

Preferably, the front electrical lapping guide pad and the back electrical lapping guide pad are formed on the cutting portion of the femto-type row bar.

Preferably, the test pad and the common test pad are formed on the cutting portion of the shunting-type row bar.

In a preferable embodiment, the first voltage is +1V, the second voltage is 0V, the third voltage is +1V, and the fourth voltage is 0V.

In comparison with the prior art of the measuring method, the method of the present invention can measure two types of row bar without switching a measuring apparatus such as a probe card. Thus, the downtime of the machine is shortened, and the manpower cost is reduced. Furthermore, due to no probe card is needed to switch, thus the damage probability of probe card is reduced greatly, and the life of the probe card is extended as a result. As the method of present invention is easy to operate and perform, therefore the applied range thereof is quite broad, which can obtain a great economic benefit to the manufacturer of the present field.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
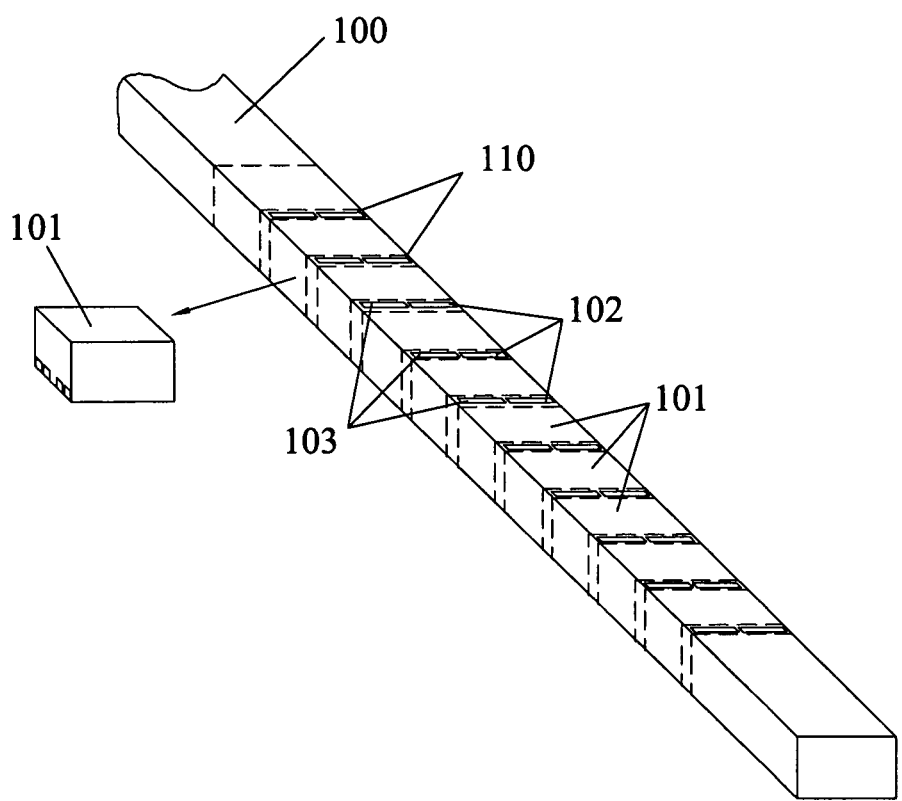
FIG. 1 shows the structure of a femto-type row bar.

Various preferred embodiments of the invention will now be described with reference to the figures, wherein like reference numerals designate similar parts throughout the various views. As indicated above, the invention is directed to a method of measuring slider resistance of different types of row bar with a common tester, the method comprises judging the type of the row bar, if the row bar is femto-type row bar, contacting the front electrical lapping guide pads of the sliders with the front pins of the probe card respectively, and contacting the back electrical lapping guide pads of the sliders with the back pins of the probe card respectively; then supplying a first voltage to the front pins, and supplying a second voltage that is unequal to the first voltage to the back pins, thereby obtaining resistances of the sliders; if the row bar is shunting-type row bar, contacting the common test pad of the shunting-type row bar with one of the front pins of the probe card, and contacting the test pads of the sliders with the rest of the front pins of the probe card respectively; and then supplying a third voltage to the front pins which contact the test pads, and supplying a fourth voltage that is unequal to the third voltage to the front pin that contacts the common test pad, thereby obtaining resistances of the sliders. In such a design, it can measure two types of row bar without switching a probe card, which shorten the downtime of the machine, and reduce the manpower cost. Furthermore, the damage probability of probe card is reduced greatly, and the life of the probe card is extended as a result.

FIG. 1 shows the structure of a femto-type row bar 100, as illustrated, the femto-type row bar includes a plurality of sliders 101 collocated thereon, and several cutting portions 110 are formed adjacent to each slider 101. Concretely, each cutting portion 110 has a front ELG pad 102 and a back ELG pad 103 formed on the surface thereof. Concretely, the front ELG pad 102 connects to one pole of the slider 101 inside, and the back ELG pad 103 connect to another pole of the slider 101 inside. As shown, the front ELG pad 102 and the back ELG pad 103 are arranged apart.

Figure 2:
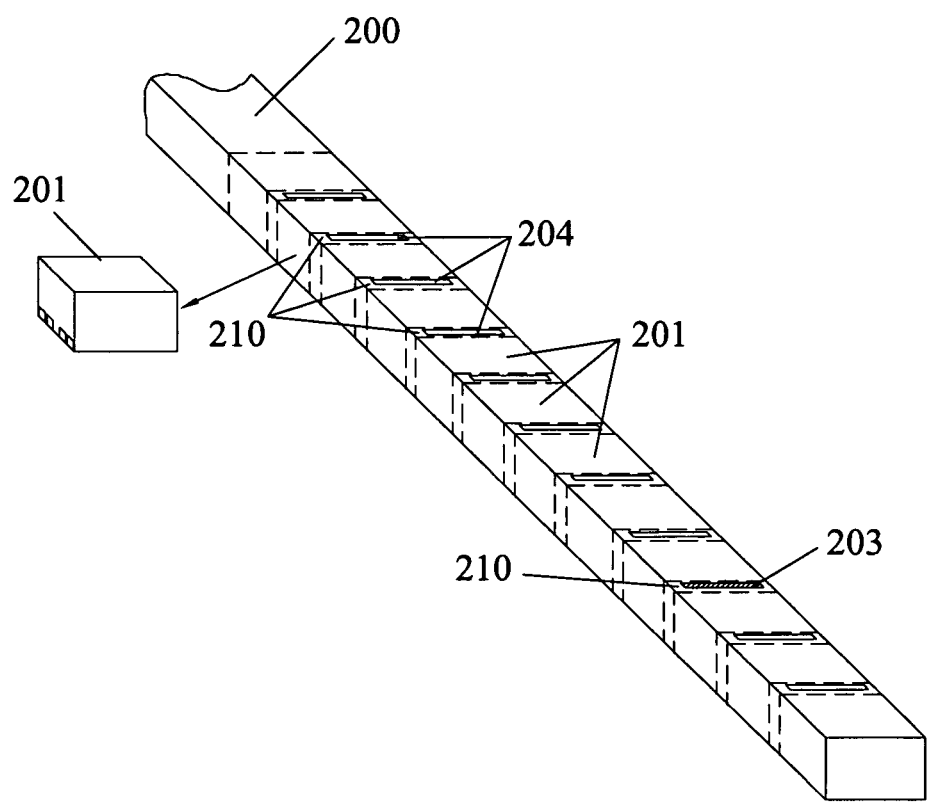
FIG. 2 shows the structure of a shunting-type row bar.

FIG. 2 shows the structure of a shunting-type row bar 200, as illustrated, the shunting-type row bar 200 includes a set of sliders 201 collocated thereon, and several cutting portions 210 are formed adjacent to each slider 201. One pole of each slider 201 is connected together to an internal common port that is coupled to an external common test pad 203. Preferably, the common test pad 203 is formed on one of cutting portion 210, which is arranged among the sliders 201 on the shunting-type row bar 200. Concretely, there is a common test pad 203 disposed among every nine sliders 201, thus there will be several common test pads 203 arranged on a shunting-type row bar 200. A test pad 204 is formed on the surface of the other cutting portions 210 respectively, which is connected to another pole of slider 201 interiorly.

Figure 3:
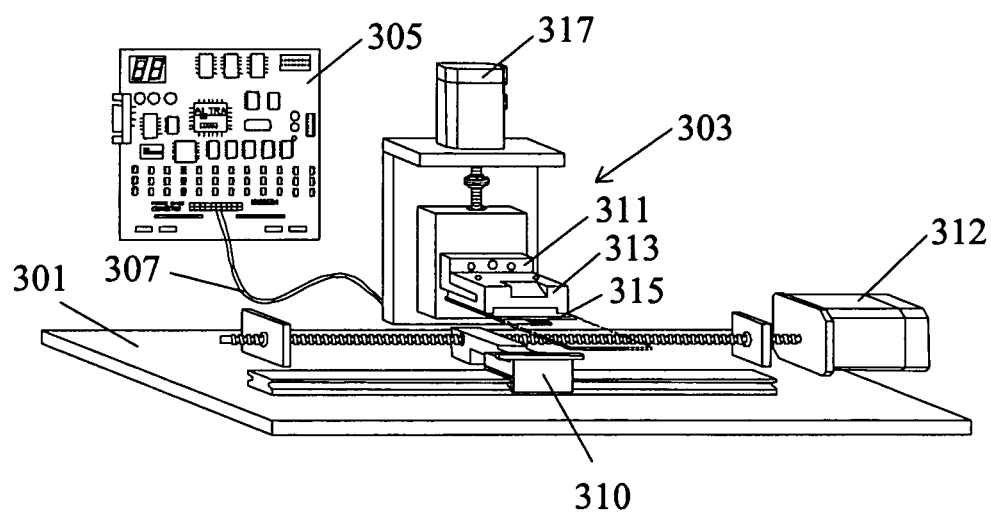
FIG. 3 shows a common tester for measuring slider resistance of a row bar.

FIG. 3 shows a common tester 300 for measuring slider resistance of a row bar. The common tester 300 includes a work platform 301 that is served to the row bar, a measuring device 303 that performs a measuring operation to the row bar, and a measuring board 305 coupled to the measuring device 303 via a cable 307. Concretely, the work platform 301 includes a loading table 310 for supported the row bar thereon, and an X-axis motor 312 controlling the loading table 310 to move left or right. The measuring device 303 includes a fixture 311, a holder 313, and a probe card 315, each of which is assembled together and connected to a Z-axis motor 317. The probed card 315 and the other elements can move up and down controlled by the Z-axis motor 317.

Figure 4:
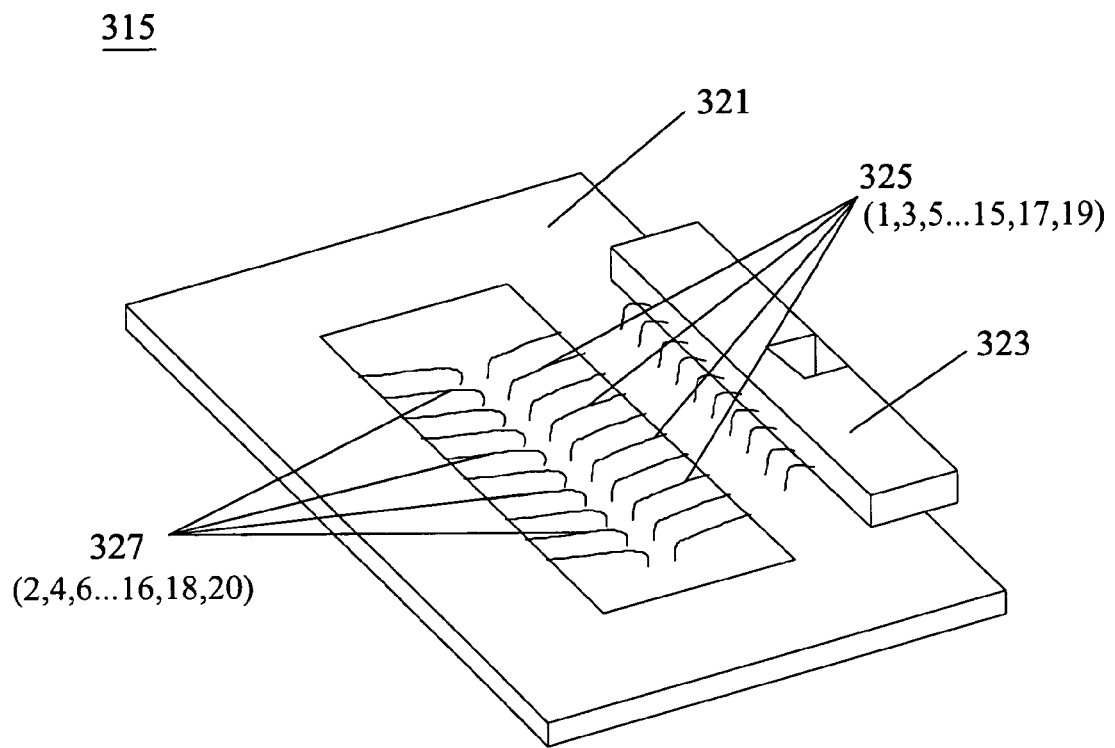
FIG. 4 shows the detailed structure of a probe card.

As illustrated in FIG. 4, the probe card 315 includes a base board 321, a connector 323 formed on the base board 321, a row of front pins 325 and a row of back pins 327. Concretely, the amount of front pins 325 and the back pins 327 is ten respectively. Each pin connects with the connector 323 and then connects to the measuring board 305 by the cable 307. Here, the front pins 325 are arranged an uneven serial number from 1-19 in turn respectively, and the back pins 327 are arranged an even serial number form 2-20.

Figure 5:
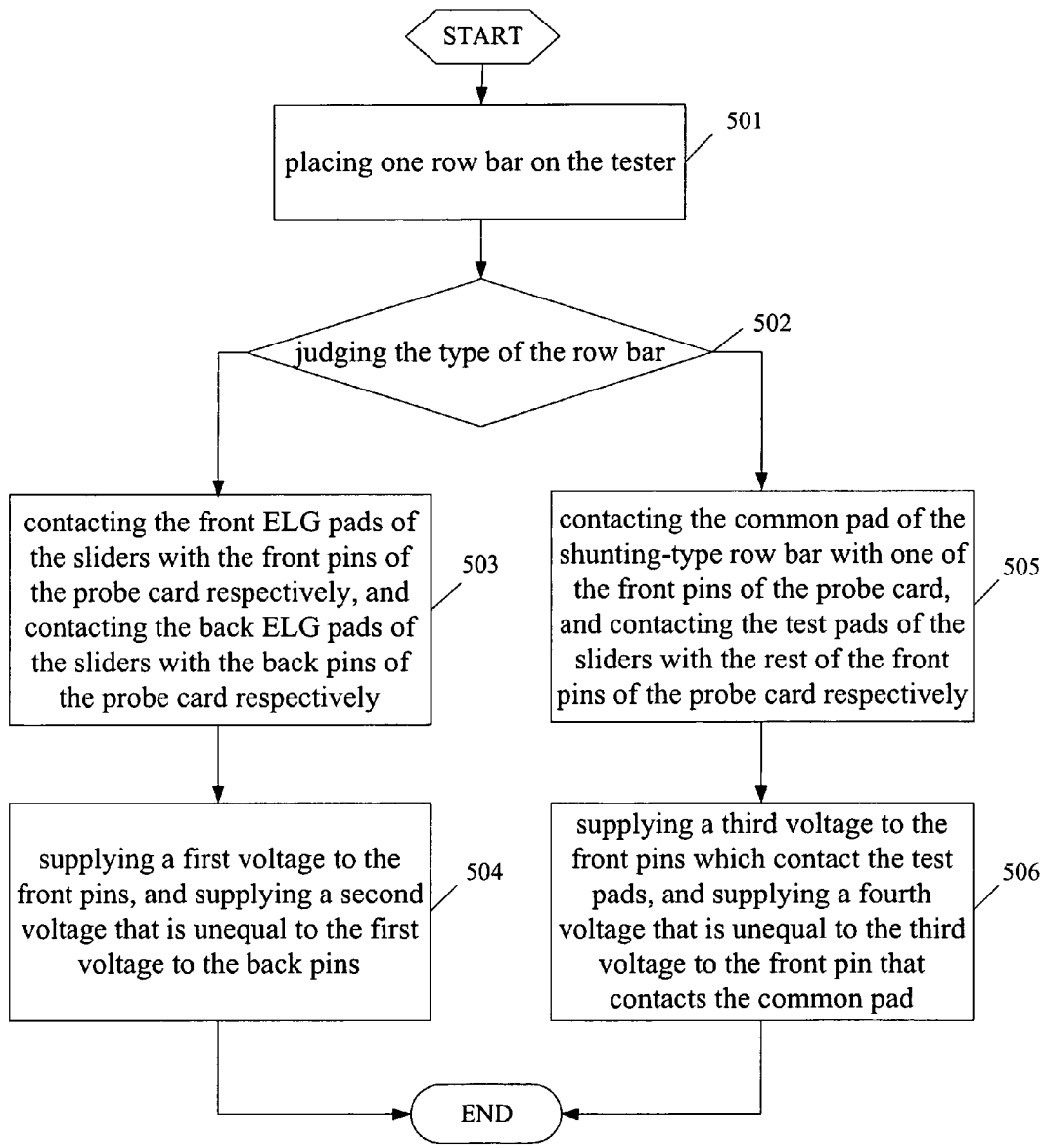
FIG. 5 is a flowchart that shows a method of measuring slider resistance of different types of row bar with a common tester according to one embodiment of the present invention.

Now, FIG. 5 is a flowchart that shows a method of measuring slider resistance of different types of row bar with a common tester according to one embodiment of the present invention, the instant method includes steps of:

Step 501, placing one row bar on the tester;

Step 502, judging the type of the row bar. Concretely, if the row bar is femto-type row bar, performing steps 503-504, and if the row bar is shunting-type row bar, performing steps 505-506. It should be noticed that, the judging method here is a common method, which can be achieved by storing the type information of row bar in a control system, and after receiving an outer type information of row bar, comparing the present information with the inner type information stored beforehand, then outputting a judging result.

Step 503, contacting the front ELG pads of the sliders with the front pins of the probe card respectively, and contacting the back ELG pads of the sliders with the back pins of the probe card respectively;

Step 504, supplying a first voltage to the front pins, and supplying a second voltage that is unequal to the first voltage to the back pins, thereby obtaining resistances of the sliders, and the measuring process is terminated. In the embodiment, the first voltage is +1V, the second voltage is 0V, that is, the back pins are grounded.

Step 505, contacting the common test pad of the shunting-type row bar with one of the front pins of the probe card, and contacting the test pads of the sliders with the rest of the front pins of the probe card respectively; and Step 506, supplying a third voltage to the front pins which contact the test pads, and supplying a fourth voltage that is unequal to the third voltage to the front pin that contacts the common test pad, thereby obtaining resistances of the sliders, and the measuring process is terminated. Here, the back pins are shut off, that is, there is no voltage supplied thereto. In the present embodiment, the pins of No. 1-17 are supplied the third voltage with +1V, and the pin of No. 19 contacts the common test pad which is supplied the fourth voltage with 0V, that is, the pin is grounded.

The method according to the present embodiment of the present invention could judge the type of row bar, and then perform a proper measuring operation. The instant method can measure two different types of row bar without switching the probe card, which can shorten the downtime of the machine, and reduce the manpower cost. Moreover, the damage probability of probe card is reduced greatly, and the life of the probe card is extended as a result.

Figure 6:
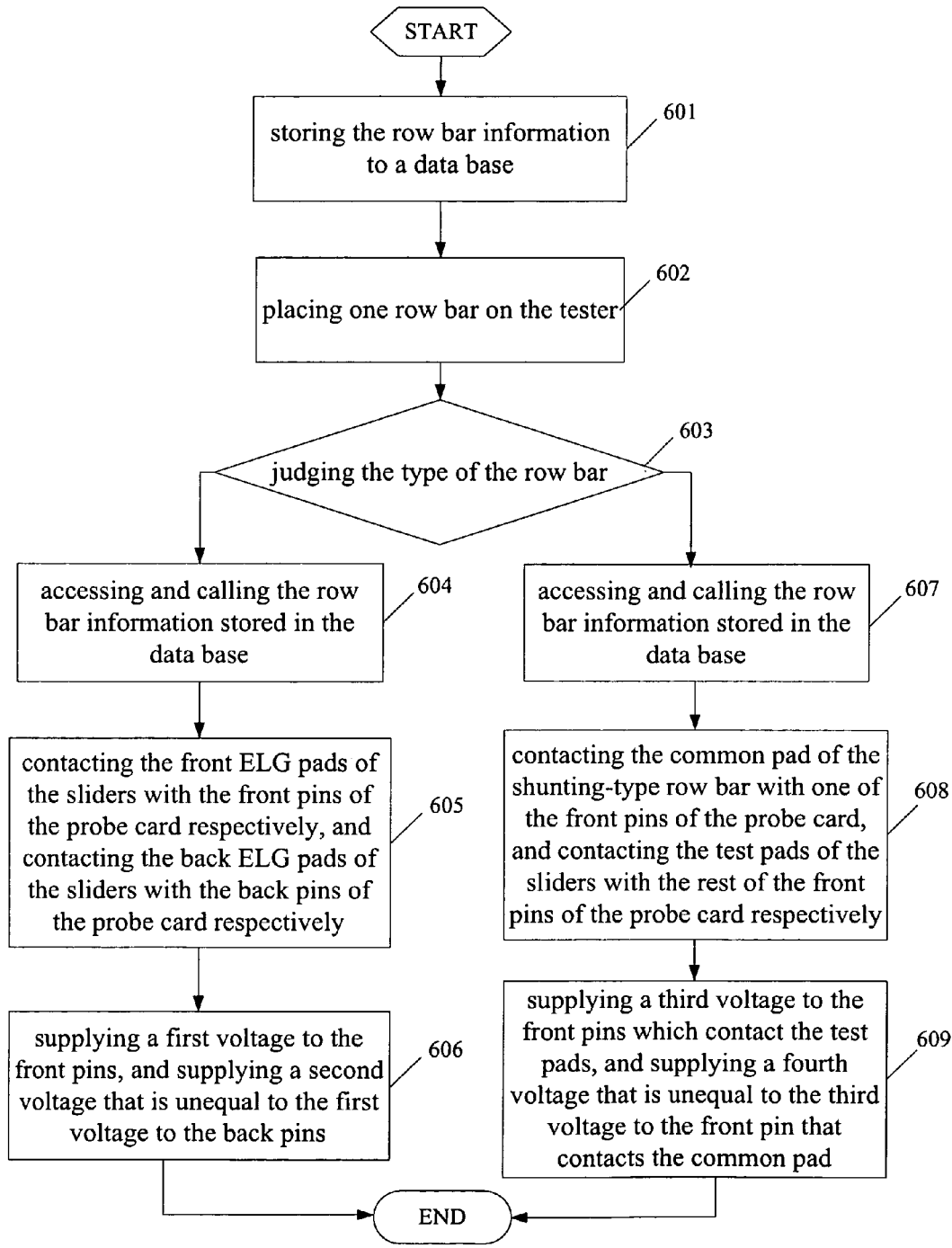
FIG. 6 is a flowchart that shows a method of measuring slider resistance of different types of row bar with a common tester according to another embodiment of the present invention.

FIG. 6 is a flowchart that shows a method of measuring slider resistance of different types of row bar with a common tester according to another embodiment of the present invention, the instant method includes steps of:

Step 601, storing the row bar information to a data base. Concretely, the row bar information includes type information of row bar and amount information of sliders.

Step 602, placing one row bar on the tester;

Step 603, judging the type of the row bar. Concretely, if the row bar is femto-type row bar, performing steps 604-606, and if the row bar is shunting-type row bar, performing steps 607-609;

Step 604, accessing and calling the row bar information stored in the data base. In this step, the row bar information contains—type: femto-type row bar; slider amount: 10.

Step 605, contacting the front ELG pads of the sliders with the front pins of the probe card respectively, and contacting the back ELG pads of the sliders with the back pins of the probe card respectively;

Step 606, supplying a first voltage to the front pins, and supplying a second voltage that is unequal to the first voltage to the back pins, thereby obtaining resistances of the sliders, and the measuring process is terminated. In the embodiment, the first voltage is +2V, the second voltage is +1V. It should be noticed that, the voltage value is not restricted the above embodiments, any voltage can be use as long as a voltage difference occurs.

Step 607, accessing and calling the row bar information stored in the data base. In this step, the row bar information contains—type: shunting-type row bar; slider amount: 9.

Step 608, contacting the common test pad of the shunting-type row bar with one of the front pins of the probe card, and contacting the test pads of the sliders with the rest of the front pins of the probe card respectively;

Step 609, supplying a third voltage to the front pins which contact the test pads, and supplying a fourth voltage that is unequal to the third voltage to the front pin that contacts the common test pad, thereby obtaining resistances of the sliders, and the measuring process is terminated. In this embodiment, the back pins are shut off, that is, there is no voltage supplied thereto. The pins of No. 1-17 are supplied the third voltage with +2V, and the pin of No. 19 contacts the common test pad which is supplied the fourth voltage with +1V.

It should be noticed that, the slider amount of each type of row bar is not restricted here, the more sliders can be arranged. When measure next set of sliders, control the row bar to move forwards accurately.

As explained above, the method of measuring slider resistance of different types of row bar with a common tester according to the present embodiment of the present invention could judge the type of row bar, and then perform a different proper measuring operation. If the row bar is shunting-type or femto-type row bar, two different operations are performed to form a current loop on each slider, thereby a resistance value can be measured out. The instant method can measure two different types of row bar without switching the probe card, which can shorten the downtime of the machine, and reduce the manpower cost. Moreover, the damage probability of probe card is reduced greatly, and the life of the probe card is extended as a result. As the method of present invention is easy to operate and perform, therefore the applied range thereof is quite broad, which can obtain a great economic benefit to the manufacturer of the present field.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A method of using a common tester to measure slider resistance for different types of row bars, the types of row bars comprising femto-type row bars and shunting-type row bars, wherein the femto-type row bars comprise a row of sliders, each of which has a front electrical lapping guide pad and a back electrical lapping guide pad, wherein the shunting-type row bars comprise at least one set of sliders and one common test pad connecting with the set of sliders, each slider of the shunting-type row bars having a test pad, the tester having a probe card with a row of front pins and a row of back pins, and the method comprising:

(1) placing one row bar on the tester; the placed row bar being either femto type or shunting type;

(2) determining a type of the row bar placed on the tester;

when the determining indicates that the row bar placed on the tester is a femto-type row bar;

(3) contacting the front electrical lapping guide pads of the sliders with the front pins of the probe card respectively, and contacting the back electrical lapping guide pads of the sliders with the back pins of the probe card respectively; and (4) supplying a first voltage to the front pins, and supplying a second voltage that is unequal to the first voltage to the back pins, thereby obtaining resistances of the sliders; and when the determining indicates that the row bar placed on the tester is a shunting-type row bar;

(5) shutting off the back pins by supplying no voltage thereto, contacting the common test pad of the shunting-type row bar with one of the front pins of the probe card, and contacting the test pads of the sliders with the rest of the front pins of the probe card respectively; and (6) supplying a third voltage to the front pins which contact the test pads, and supplying a fourth voltage that is unequal to the third voltage to the front pin that contacts the common test pad, thereby obtaining resistances of the sliders.

2. The method as claimed in claim 1, wherein the method further comprises:

storing the row bar information to a data base before placing one row bar on the tester.

3. The method as claimed in claim 2, wherein the row bar information includes type information of row bar and amount information of sliders.

4. The method as claimed in claim 3, wherein after judging the type of the row bar, the method further comprises:

accessing and calling the row bar information stored in the data base.

5. The method as claimed in claim 1, wherein the probe card has ten front pins and ten back pins.

6. The method as claimed in claim 1, wherein the row bar further comprises cutting portions formed adjacent to each slider respectively.

7. The method as claimed in claim 6, wherein the front electrical lapping guide pad and the back electrical lapping guide pad are formed on the cutting portion of the femto-type row bar.

8. The method as claimed in claim 6, wherein the test pad and the common test pad are formed on the cutting portion of the shunting-type row bar.

9. The method as claimed in claim 1, wherein the first voltage is +1V, the second voltage is 0V, the third voltage is +1V, and the fourth voltage is 0V.

* * * * *